(12) United States Patent
Wang et al.

(10) Patent No.: US 11,817,421 B2
(45) Date of Patent: Nov. 14, 2023

(54) METHOD FOR MANUFACTURING SEMICONDUCTOR PACKAGE STRUCTURE

(71) Applicant: Advanced Semiconductor Engineering, Inc., Kaohsiung (TW)

(72) Inventors: Yi Dao Wang, Kaohsiung (TW); Tung Yao Lin, Kaohsiung (TW); Rong He Guo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 36 days.

(21) Appl. No.: 17/344,741

(22) Filed: Jun. 10, 2021

(65) Prior Publication Data

US 2022/0399303 A1    Dec. 15, 2022

(51) Int. Cl.
*H01L 23/00* (2006.01)
*H01L 25/065* (2023.01)
*H01L 25/00* (2006.01)
*H01L 21/48* (2006.01)

(52) U.S. Cl.
CPC .......... *H01L 24/81* (2013.01); *H01L 21/4853* (2013.01); *H01L 24/16* (2013.01); *H01L 25/0655* (2013.01); *H01L 25/50* (2013.01); *H01L 2224/16227* (2013.01); *H01L 2224/81224* (2013.01); *H01L 2224/81815* (2013.01)

(58) Field of Classification Search
None
See application file for complete search history.

(56) References Cited

U.S. PATENT DOCUMENTS

2022/0367408 A1*    11/2022    Chen ................... H01L 23/3114

\* cited by examiner

*Primary Examiner* — Long Pham
(74) *Attorney, Agent, or Firm* — FOLEY & LARDNER LLP

(57) ABSTRACT

A method for manufacturing a semiconductor package structure is provided. The method includes: (a) providing a substrate, wherein an upper surface of the substrate includes a predetermined region and an energy-absorbing region adjacent to the predetermined region; (b) disposing a first device in the predetermined region of the upper surface of the substrate; and (c) bonding the first device to the substrate by irradiating an upper surface of the first device with an energy-beam, wherein a center of the energy-beam is moved toward the energy-absorbing region from a first position before bonding.

19 Claims, 9 Drawing Sheets

METHOD FOR MANUFACTURING SEMICONDUCTOR PACKAGE STRUCTURE

BACKGROUND

1. Field of the Disclosure

The present disclosure relates to a method for manufacturing a semiconductor package structure, and in particularly to a method by using energy-beams to form bonding joints.

2. Description of the Related Art

Based on laser's quick heating property, laser assisted bonding (LAB) has been used to replace a conventional reflow process to melt bumps, solder balls, pads and/or other electrical connecting elements to achieve the purpose of fine pitch flip chip bonding. However, due to different thermal conductivity of different materials, LAB may be prone to damaging materials, such as epoxy molding compound or a substrate. In order to solve aforementioned problems, a new method for manufacturing a semiconductor package structure is required.

SUMMARY

In some embodiments, a method for manufacturing a semiconductor package structure includes: (a) providing a substrate, wherein an upper surface of the substrate includes a predetermined region and an energy-absorbing region adjacent to the predetermined region; (b) disposing a first device in the predetermined region of the upper surface of the substrate; and (c) bonding the first device to the substrate by irradiating an upper surface of the first device with an energy-beam, wherein a center of the energy-beam is moved toward the energy-absorbing region from a first position before bonding.

In some embodiments, a method for manufacturing a semiconductor package structure includes: (a) providing a substrate, wherein an upper surface of the substrate comprises a predetermined region and a metal-rich region adjacent to the predetermined region; (b) disposing a first device in the predetermined region of the upper surface of the substrate; and (c) bonding the first device to the substrate by irradiating an upper surface of the first device with an energy-beam, wherein a center of the energy-beam is moved toward the metal-rich region from a first position before bonding.

In some embodiments, a method for manufacturing a semiconductor package structure includes: (a) providing a substrate and disposing a first device on an upper surface of the substrate; and (b) irradiating an upper surface of the first device with an energy beam to form bonding joints between an interface of the substrate and the first device, wherein prior to the irradiation a center of the energy beam is shifted from being substantially aligned with a center of the upper surface of the first device toward a position having a relatively low temperature in a temperature distribution of the upper surface of the device.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
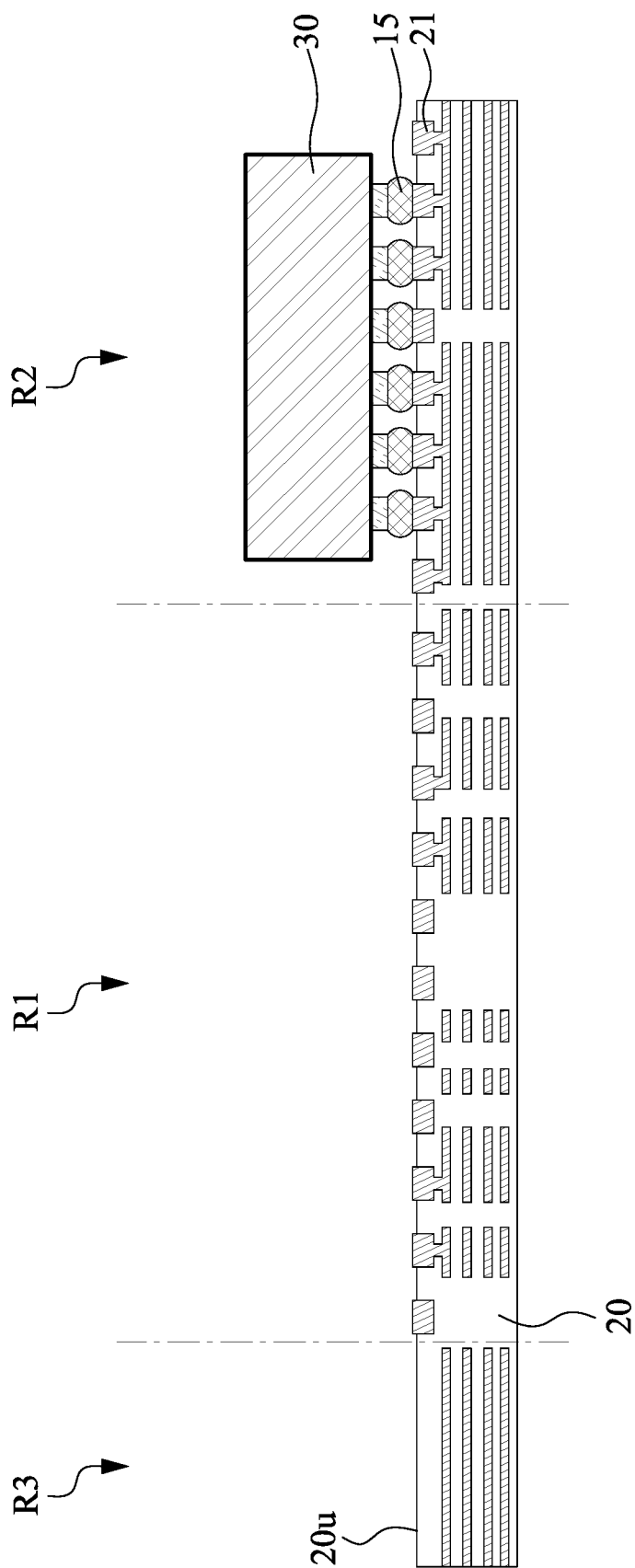
FIGS. 1A, 2A, 3A and 4A illustrate cross-sectional views of various stages of a method for manufacturing a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIGS. 1A, 2A, 3A and 4A illustrate cross-sectional views of various stages of a method for manufacturing a semiconductor package structure according to some embodiments of the present disclosure. FIGS. 1B, 2B, 3B and 4B are top views of the stages illustrated in FIGS. 1A, 2A, 3A and 4A, respectively.

Figure 1B:
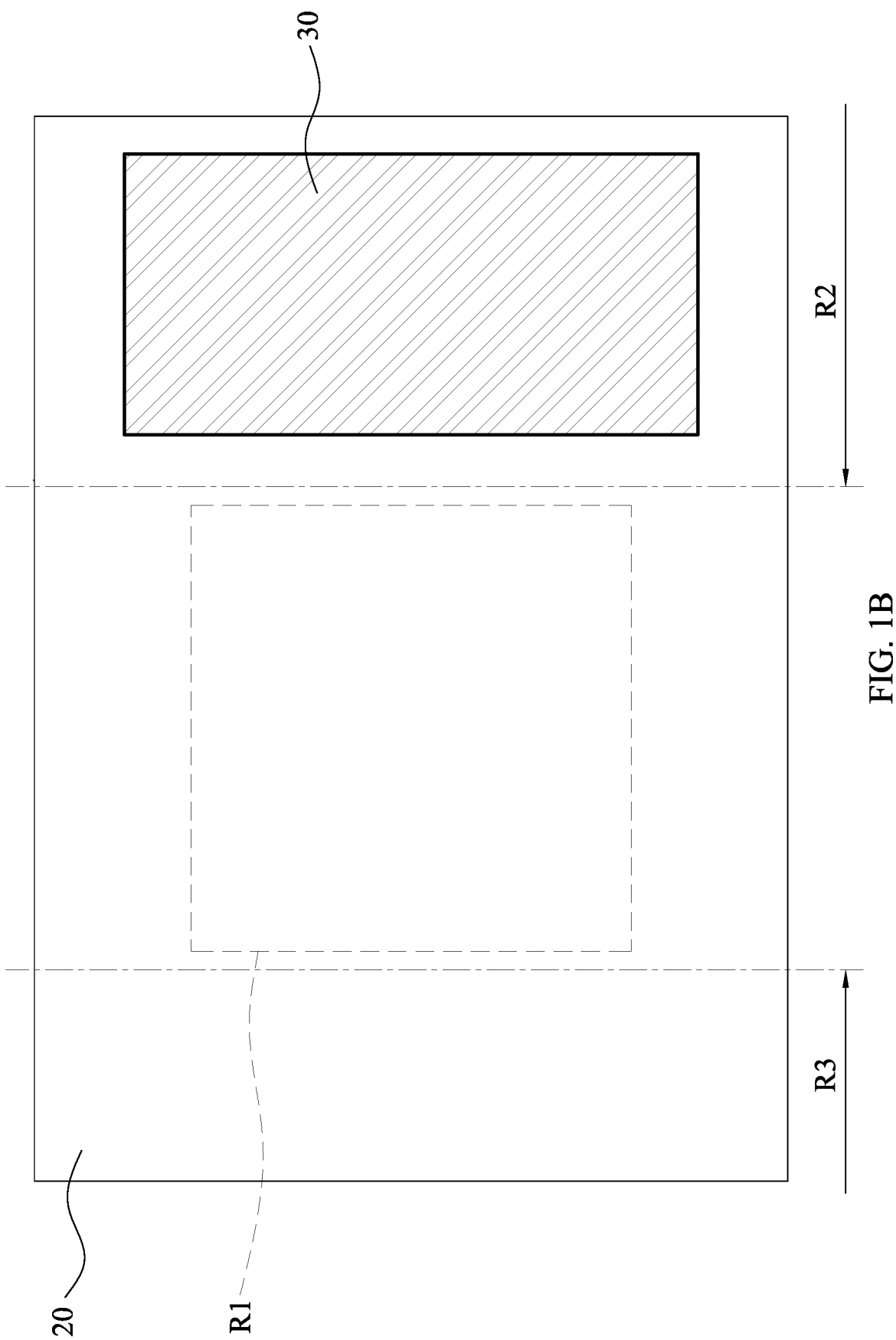
FIGS. 1B, 2B, 3B and 4B illustrate top views of various stages of a method for manufacturing a semiconductor package structure according to some embodiments of the present disclosure.

Referring to FIGS. 1A and 1B, a substrate 20 may be provided. The substrate 20 may include, for example, a semiconductor substrate, an insulating core substrate, a printed circuit board or other suitable substrates. The semiconductor substrate may include a bulk semiconductor, a semiconductor-on-insulator (SOI) substrate, or the like. The insulating core substrate may include, a fiberglass reinforced resin core (e.g., FR4), a Prepreg (PP), Ajinomoto build-up film (ABF), a photo-sensitive material or other suitable materials. The printed circuit board may include, for example, a paper-based copper foil laminate, a composite copper foil laminate, or a polymer-impregnated glass-fiber-based copper foil laminate. The substrate 20 may include one or more interconnection structures, such as a redistribution layer (RDL) or a grounding element. The substrate 20 may include conductive pads 21 (also referred to as "pad" hereinafter). In some embodiments, the pads 21 may be disposed on an upper surface 20u of the substrate 20. In some other embodiments, the pads 21 may embedded in the substrate 20 and exposed from the upper surface 20u of the substrate 20.

The upper surface 20u of the substrate 20 comprises regions R1, R2 and R3. The region R1 is a predetermined region in which a device 10 will be disposed at the operation illustrated in FIGS. 2A and 2B. The region R2 is adjacent to the predetermined region R1. The region R3 is also adjacent to the predetermined region R1. In some embodiments, the region R2 may be an energy-absorbing region and is capable of absorbing more energy than other regions (e.g., R3) of the upper surface 20u of the substrate 20 adjacent to the predetermined region R1. In some embodiments, the absorbed energy may be, for example, heat. In some embodiments, the region R2 and the region R3 may include different materials or may have different circuit densities. In some embodiments, the region R2 includes materials having a relatively high thermal conductivity. In some embodiments, the region R2 may include metal, such as copper (Cu), aluminum (Al), iron (Fe), zinc (Zn), nickel (Ni), tin (Sn), lead (Pb), silver (Ag), mercury (Hg), gold (Au) or a combination thereof; silicon-containing material, such as polysilicon; or other suitable materials. In some embodiments, the region R3 may include materials having a relatively low thermal conductivity. In some embodiments, the region R3 may include solder mask or polymeric material. In some embodiments, the region R2 may have a relatively high circuit density than other regions (e.g., R3) of the upper surface 20u of the substrate 20 adjacent to the predetermined region R1; for example, the area occupied by metal lines per unit area of the region R2 is greater than the area occupied by the metal lines per unit area of other regions (e.g., R3) of the upper surface 20u of the substrate 20 adjacent to the predetermined region R1. The area occupied by metal lines per unit area of the region R2 greater than the area occupied by the metal lines per unit area of other regions can be achieved, for example, by arranging more metal lines (i.e., dense lines) or arranging metal lines having larger width (wide lines) in a unit area of the region R2. In some embodiments, the region R2 may have a relatively large number of Input (I)/Output (0) connections or pads 21 than other regions (e.g., R3) of the upper surface 20u of the substrate 20 adjacent to the predetermined region R1. In some embodiments, the region R2 has a metal content greater than other regions (e.g., R3) of the upper surface 20u of the substrate 20 adjacent to the predetermined region R1. In the present disclosure, the comparison of circuit density, number of Input (I)/Output (0) connections or pads, or metal content, etc., in two regions are made based on the circuit density, number of Input (I)/Output (0) connections or pads, or metal content per unit area in each of the regions.

In some embodiments, the region R2 may be a metal-rich region and may include metal, such as copper (Cu), aluminum (Al), iron (Fe), zinc (Zn), nickel (Ni), tin (Sn), lead (Pb), silver (Ag), mercury (Hg), gold (Au) or a combination thereof as discussed above. The metal-rich region R2 has a metal content greater than other regions (e.g., R3) of the upper surface 20u of the substrate 20 adjacent to the device 10. In some embodiments, the metal-rich region R2 may have a higher circuit density than other regions (e.g., R3) of the upper surface 20u of the substrate 20 adjacent to the device 10. For example, the area occupied by metal lines per unit area of the metal-rich region R2 is greater than the area occupied by the metal lines per unit area of other regions (e.g., R3) of the upper surface 20u of the substrate 20 adjacent to the device 10. In some embodiments, the metal-rich region R2 may have a relatively large number of Input (I)/Output (0) connections or pads 21 than other regions (e.g., R3) of the upper surface 20u of the substrate 20 adjacent to the device 10. In some embodiments, the metal-rich region includes a significant amount of copper and the metal content refers to the copper content.

In some embodiments, one or more device 30 may be bonded to and electrically connected to the upper surface 20u of the substrate 20 at least in the region R2. In some embodiments, the region R2 may not include any device disposed on its surface. In some embodiments, electrical connectors 15 are disposed between the pads 21 of the substrate 20 and the pads (not denoted) of the device 30 and forms bonding joints. In some embodiments, a direct bonding between the substrate 20 and the device 30 is formed (i.e., without the use of electrical connectors 15). The electrical connectors 15 may include, for example, solder balls, controlled collapse chip connection (C4) bumps, micro bumps or other suitable electrical connectors. The electrical connectors 15 may be formed of bonding material (s). In some embodiments, the electrical connectors 15 may include a conductive bonding material such as copper, aluminum, gold, nickel, silver, palladium, tin, other conductive bonding materials or a combination thereof. Unlike the region R2, the region R3 has less I/O connections or pads 21.

Figure 2A:
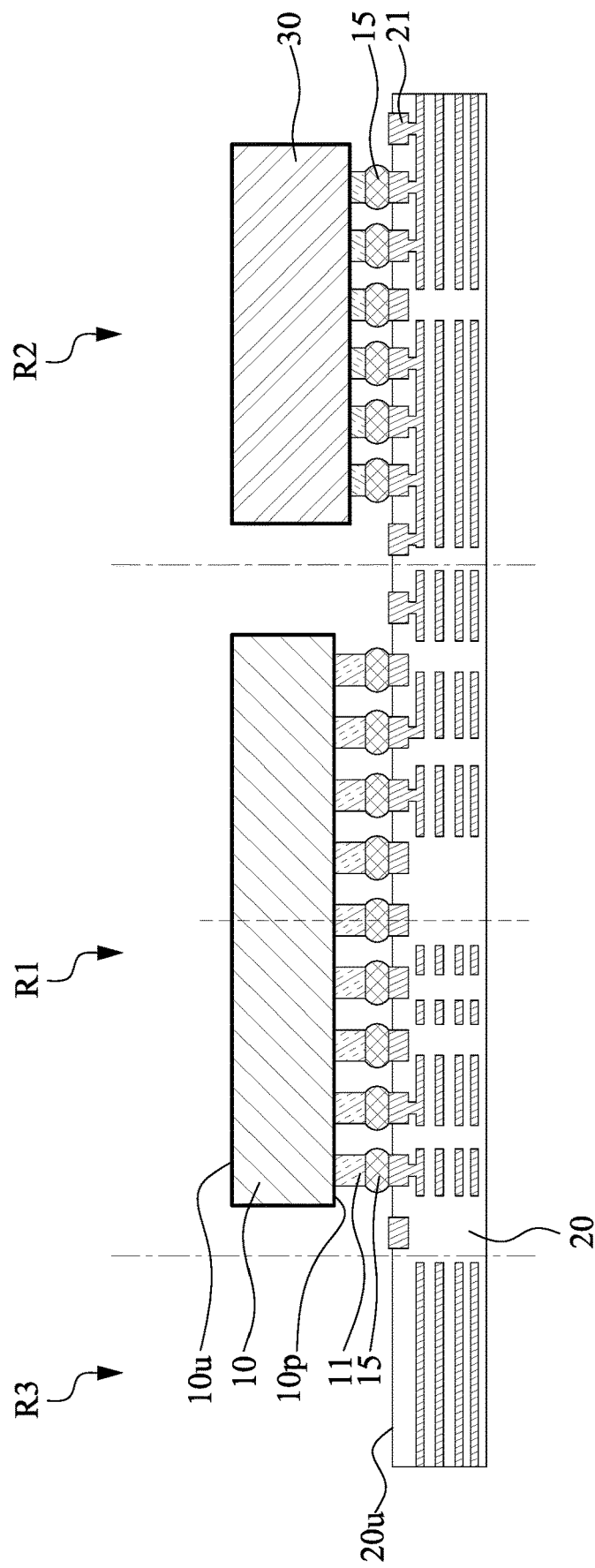
Figure 2B:
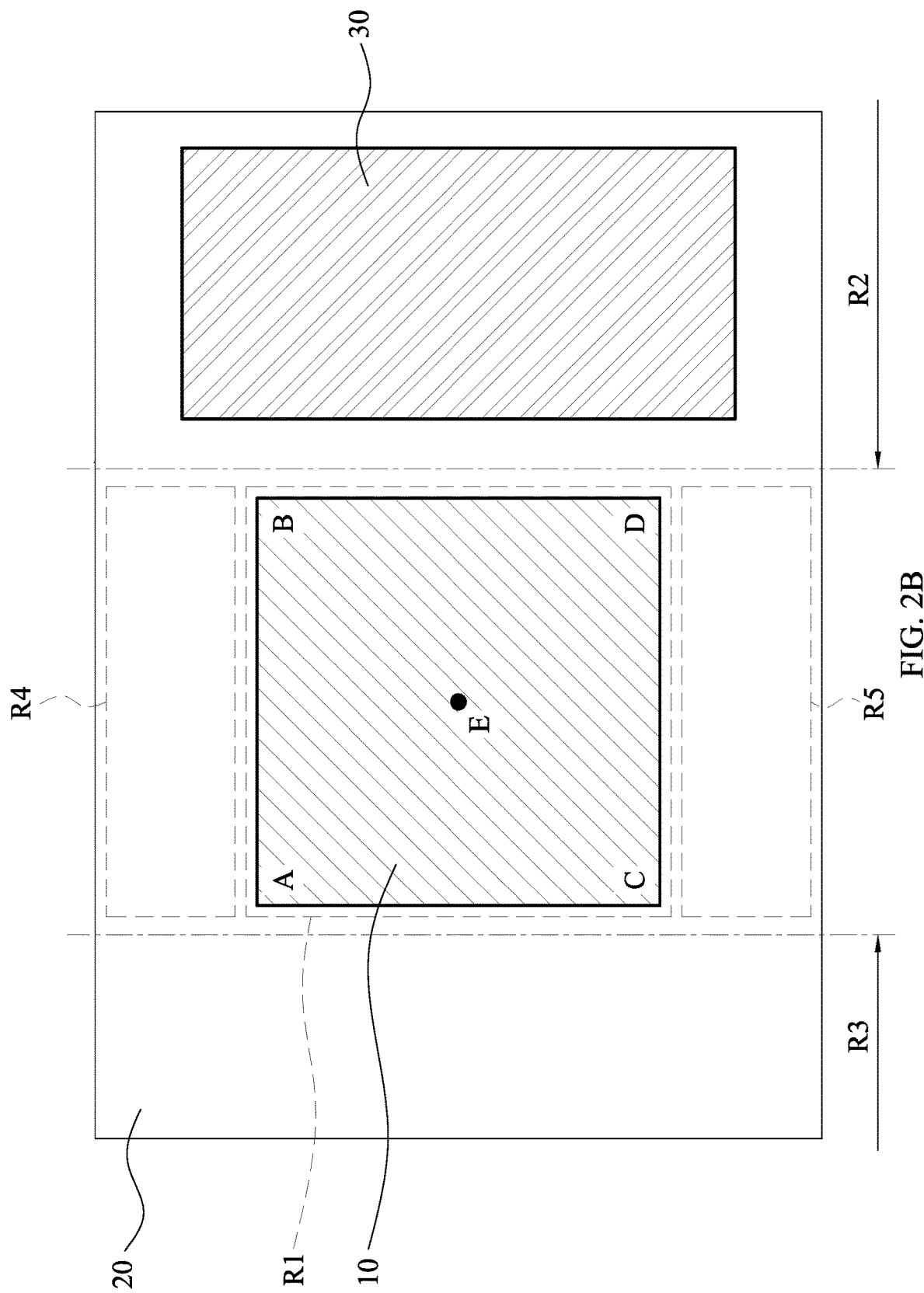

Referring to FIGS. 2A and 2B, a device 10 is disposed in the predetermined region R1. The device 10 includes an upper surface 10u and a lower surface 10p. The lower surface 10p of the device 10 may include pads or bumps 11. The pads or bumps 11 of the device 10 are substantially aligned with respective ones of the pads 21 of the substrate 20 in the predetermined region R1. In some embodiments, the conductive bonding materials 15 are disposed between the pads or bumps 11 of the device 10 and the pads 21 of the substrate 20 in the predetermined region R1 to form electrical connectors or bonding joints after being irradiated by an energy beam (i.e., the operation illustrated in FIGS. 4A and 4B). In some embodiments, the conductive bonding materials 15 are not disposed between the pads or bumps 11 of the device 10 and the pads 21 of the substrate 20 in the predetermined region R1, a direct bonding between the substrate 20 and the device 10 may be formed after being irradiated by an energy beam (i.e., the operation illustrated in FIGS. 4A and 4B).

The device 10 and/or the device 30 may include, for example, an active device, such as a semiconductor die or a chip. The device 10 and/or the device 30 may include a logic die (e.g., system on a chip (SoC), central processing unit (CPU), graphics processing unit (GPU), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), or combinations thereof. In some embodiments, the device 30 may be a memory die which requires a larger number of I/O connections or pads to electrically connect to the substrate 20.

The device 10 and/or the device 30 may be in the form of a circle, a rectangle or any other suitable shape. As illustrated in FIG. 2B, in some embodiments, the upper surface 10u the device 10 may have corners A, B, C and D and a center E. The device 30 is disposed in the region R2 of the upper surface 20u of the substrate 20, the device 10 is disposed on the predetermined region R1 of the upper surface 20u of the substrate 20, and thus the device 30 is disposed adjacent to the device 10 (e.g., adjacent to the edge BD of the device 10). In addition to the region R2, other regions may be adjacent to the predetermined region R1 (or the device 10), for example, the region R3 adjacent to the edge AC of the device 10, a region R4 adjacent to the edge AB of the device 10 and a region R5 adjacent to the edge CD of the device 10.

Figure 3A:
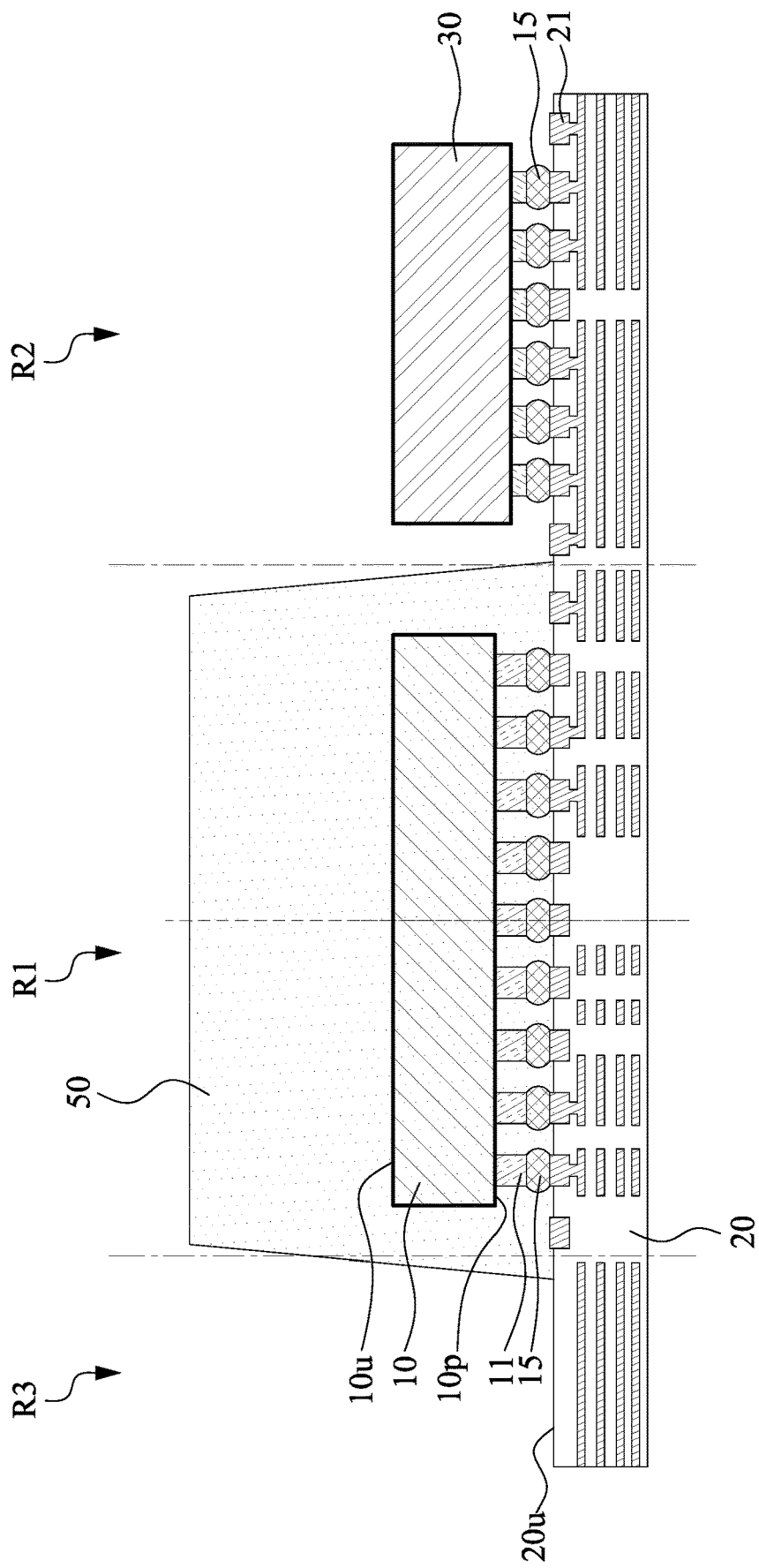
Figure 3B:
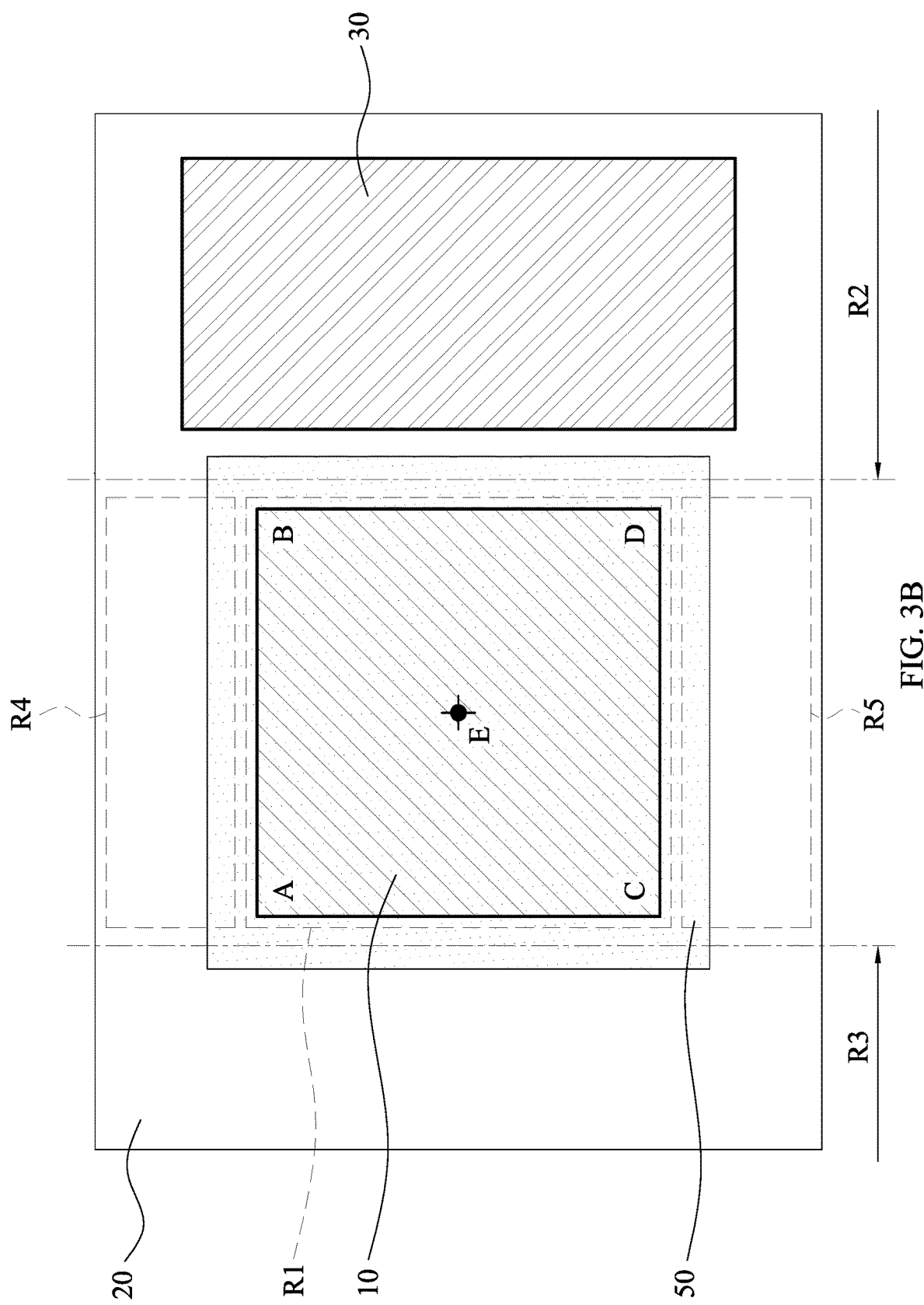

Referring to FIGS. 3A and 3B, an energy-beam 50 is provided. A center of the energy-beam 50 (i.e., the center of the irradiation area of the energy-beam; marked by cross in FIG. 3B) is substantially aligned with the center E of the upper surface 10u of the device 10. In some embodiments, the energy-beam 50 covers the entire upper surface 10u of the device 10. In other words, the irradiation area of the energy-beam 50 covers the entire upper surface 10u of the device 10 as illustrated in FIG. 3B. The irradiation area of the energy-beam 50 is greater than the upper surface 10u of the device 10. In some embodiments, the peripheral edges of the irradiation area are distant from the edges of the upper surface 10u of the device 10 about 0.5 mm, 1 mm, 1.5 mm, 2 mm, 2.5 mm or 3 mm, but are not limited thereto.

The energy-beam 50 is used to provide heat to an interface between the substrate 20 and the device 10 for forming bonding joints therebetween. For example, in some embodiments, energy-beam 50 is used to provide heat such that the bonding material 15 (if present) may be melted or fused and form bonding joints after cooling (or annealing). The energy-beam 50 may irradiate the upper surface 10u of the device 10 and transmit heat to the interface. In some embodiments, the energy-beam(s) is laser. In some embodiments, a laser assisted bonding (LAB) technique is adopted to provide energy-beam(s) for forming bonding joints.

In some embodiments, the energy-beam 50 may be laser beam and may have a wavelength ranging from about 600 nm to about 1100 nm (e.g., 600 nm, 700 nm, 800 nm, 900 nm, 1000 nm or 1100 nm). In some embodiments, the wavelength of the laser beam may be in the range of infrared radiation.

Figure 4A:
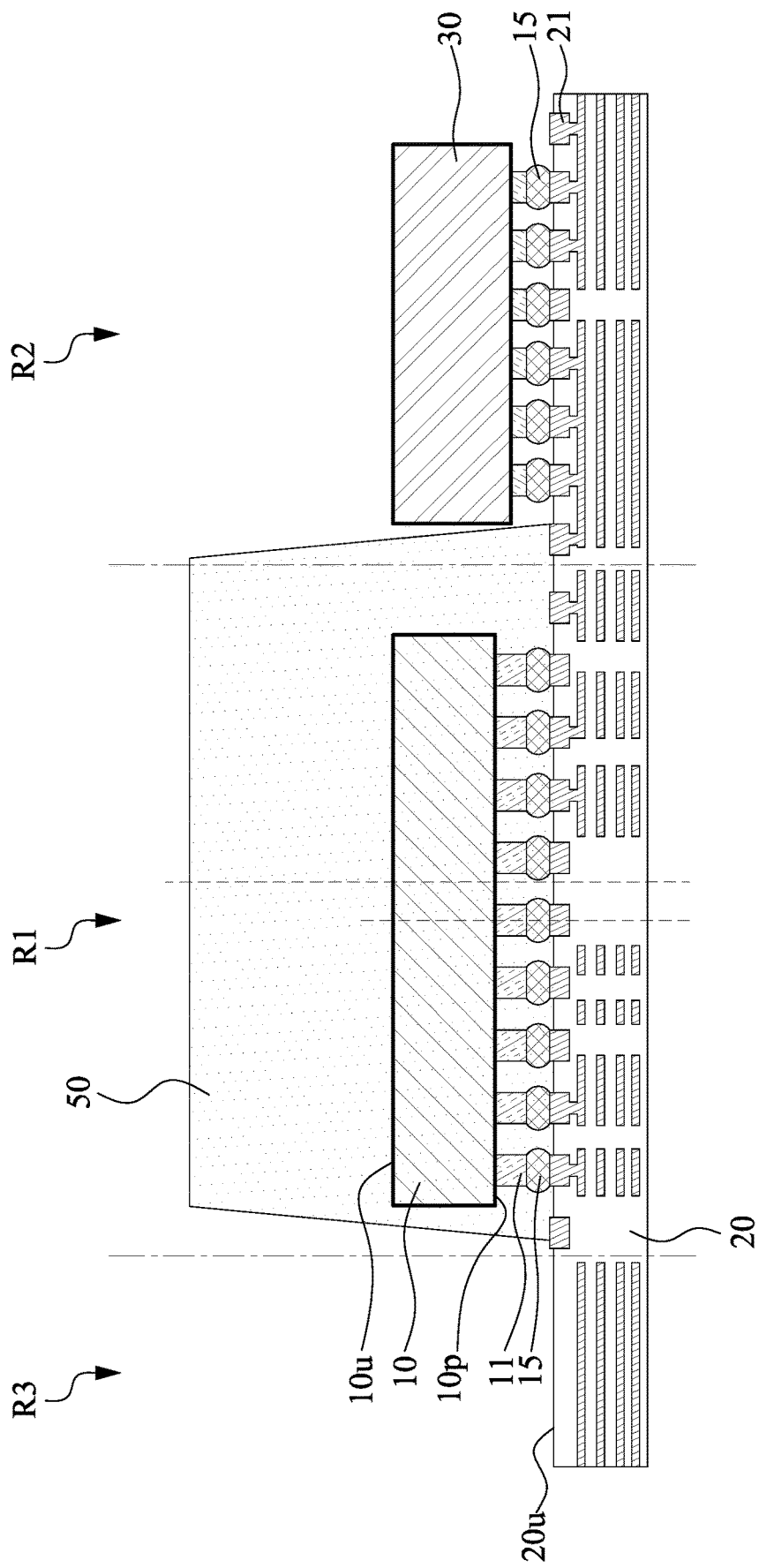
Figure 4B:
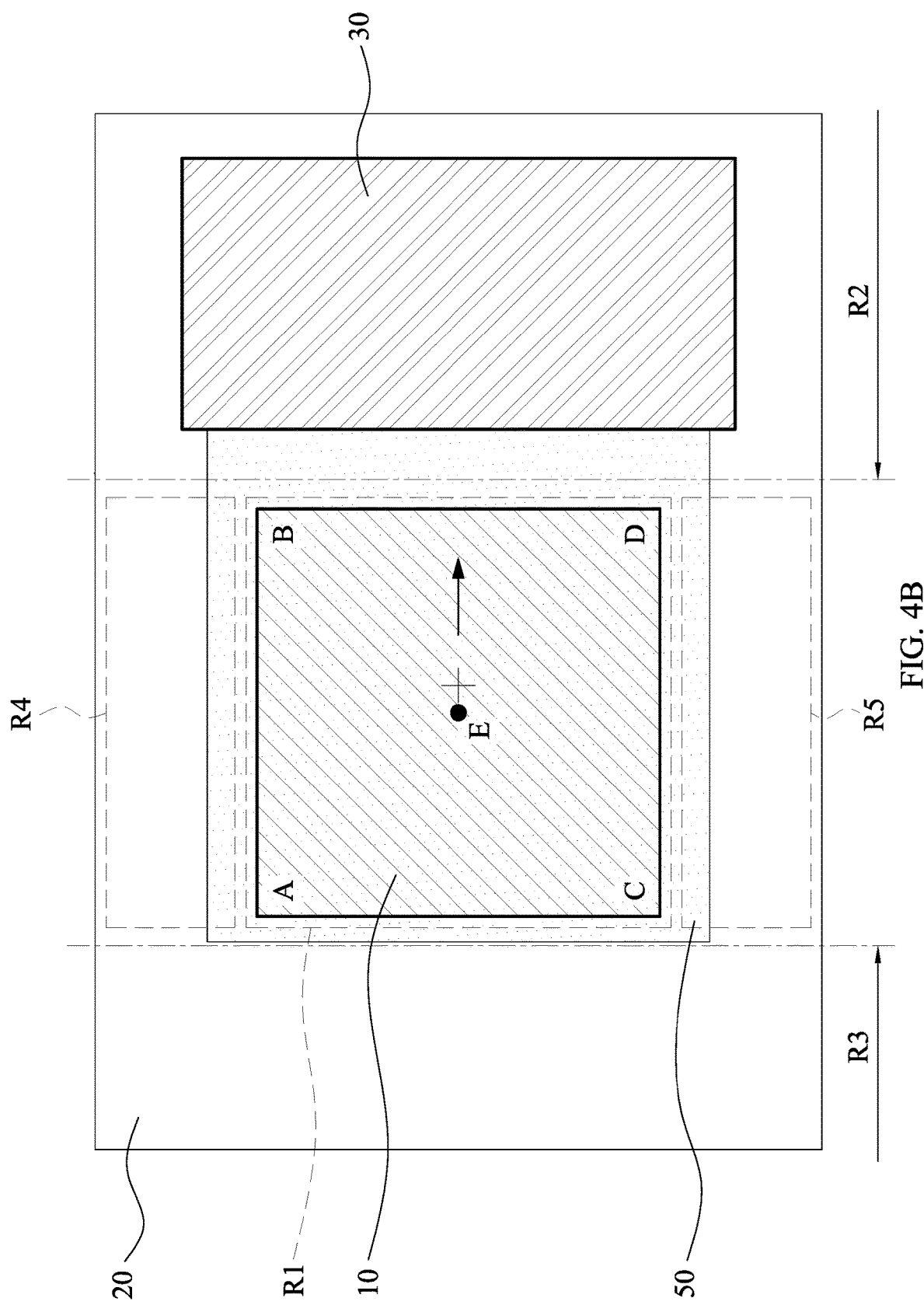

Referring to FIGS. 4A and 4B, the position of the energy-beam 50 may be adjusted before carrying out the bonding operation to bond the device 10 to the substrate 20. In some embodiments, the center of the energy-beam is moved or shifted toward the region R2 from being substantially aligned with the center E of the upper surface 10u of the device 10. The energy-beam 50 covers the entire upper surface 10u of the device 10 before and after position adjustment. Then, the bonding process is carried out by irradiating the upper surface 10u of the device 10 with the energy-beam 50 to provide sufficient heat to the interface between the substrate 20 and the device 10 for forming bonding joints.

The power of the energy-beam 50 is not particularly limited and may range from about 60 W to about 200 W, such as 60 W, 80 W, 90 W, 110 W, 130 W, 150 W, 170 W, 190 W or 200 W, but is not limited thereto. The emission time of the energy-beam 50 is not particularly limited and may range from about 300 ms to about 1800 ms, such as 300 ms, 450 ms, 600 ms, 800 ms, 1000 ms, 1200 ms or 1800 ms, but is not limited thereto. The emission time of the energy-beam 50 may be adjusted depending on the selected power of the energy-beam 50.

When the die 10 to be bonded to the substrate 20 is disposed adjacent to an energy-absorbing region or metal-rich region R2 of the upper surface 20u of the substrate 20, cold joint issues (e.g., the bonding material was not completely molten to form bonding joints) may occur at a position near the energy-absorbing region or metal-rich region R2, affecting the bonding strength of the bonding joints. Without being bound by theory, this may because the energy-absorbing region or metal-rich region R2 contains a relatively large amount of materials that are easy to absorb and/or transmit energy. Thus, when the energy beam irradiates the upper surface 20u of the substrate 20, a portion of the energy provided by the energy beam may be transmitted to the energy-absorbing region or metal-rich region R2, especially at a position near the energy-absorbing region or metal-rich region R2. Experimental data also show that the temperature of the upper surface 10u of the device 10 at a position (e.g., edge BD) near the energy-absorbing region or metal-rich region R2 is lower than the temperature of the upper surface 10u of the device 10 at a position (e.g., edge AC) away from the energy-absorbing region or metal-rich region R2, and in some embodiments, the temperature difference may be up to 20° C. or more. As a result, it becomes more difficult to ensure all of the bonding joints can be well formed at the interface between the device 10 and the substrate 20. In the present disclosure, by moving or shifting the center of the energy-beam 50 (i.e., the center of the irradiation area) toward the energy-absorbing region or metal-rich region R2 and ensuring that the energy-beam 50 covers the entire upper surface 10u of the device 10 before and after moving or position shift, it has been found that the cold joint issues can be alleviated and superior bonding joints can be formed at the interface between the device 10 and the substrate 20. In addition, the temperature difference can be reduced to 10° C. or below.

In some embodiments, the present disclosure provides a method for manufacturing a semiconductor package structure which includes a pilot run operation. The method includes the following operations: (a) providing a substrate and disposing a first device on an upper surface of the substrate; and (b) irradiating an upper surface of the first device with an energy beam to form bonding joints between an interface of the substrate and the first device, wherein prior to the irradiation a center of the energy beam is moved or shifted from being substantially aligned with a center of the upper surface of the first device toward a position having a relatively low temperature in a temperature distribution of the upper surface of the device. The temperature distribution of the upper surface of the first device is determined in the pilot-run operation.

The first device may include pads or bumps on its lower surface. In some embodiments, in step (a) soldering agent is applied on the pads or bumps on the lower surface of the first device, the first device is disposed on the upper surface of the substrate by flip chip bonding techniques such that the pads or bumps on the lower surface of the first device contact respective ones of the pads on the upper surface of the substrate via soldering agent.

In some embodiments, in step (b) the energy-beam covers the entire upper surface of the first device before and after the position shift of the center of the energy beam.

In some embodiments, in step (a) the substrate further comprises a second device bonded to the substrate and the first device is disposed adjacent the second device.

In some embodiments, in step (b) the position having a relatively low temperature in a temperature distribution of the upper surface of the first device is near a region of the upper surface of the substrate comprising a relatively large amount of materials capable of absorbing or transmitting energy (e.g., heat).

In some embodiments, in step (b) the position having a relatively low temperature in a temperature distribution of the upper surface of the first device is near a region of the upper surface of the substrate having a relatively high circuit density.

In some embodiments, in step (b) the position having a relatively low temperature in a temperature distribution of the upper surface of the first device is near a region of the upper surface of the substrate comprising a relatively large number of I/O connections or pads.

In some embodiments, the pilot-run operation includes: (i) providing another substrate and disposing another first device on an upper surface of the another substrate; (ii) irradiating an upper surface of the another first device with an energy beam to form bonding joints between an interface of the another substrate and the another first device wherein a center of the energy-beam is substantially aligned with a center of the upper surface of the another first device; and (iii) obtaining a temperature distribution of the upper surface of the another first device during or after the irradiation of energy-beam in step (ii). In some embodiments, the another substrate used in the pilot-run operation has the same configuration as the substrate used in the method for manufacturing a semiconductor package structure of the present disclosure; the another first device has the same configuration and layout design as the first device used in the method for manufacturing a semiconductor package structure of the present disclosure.

Figure 5:
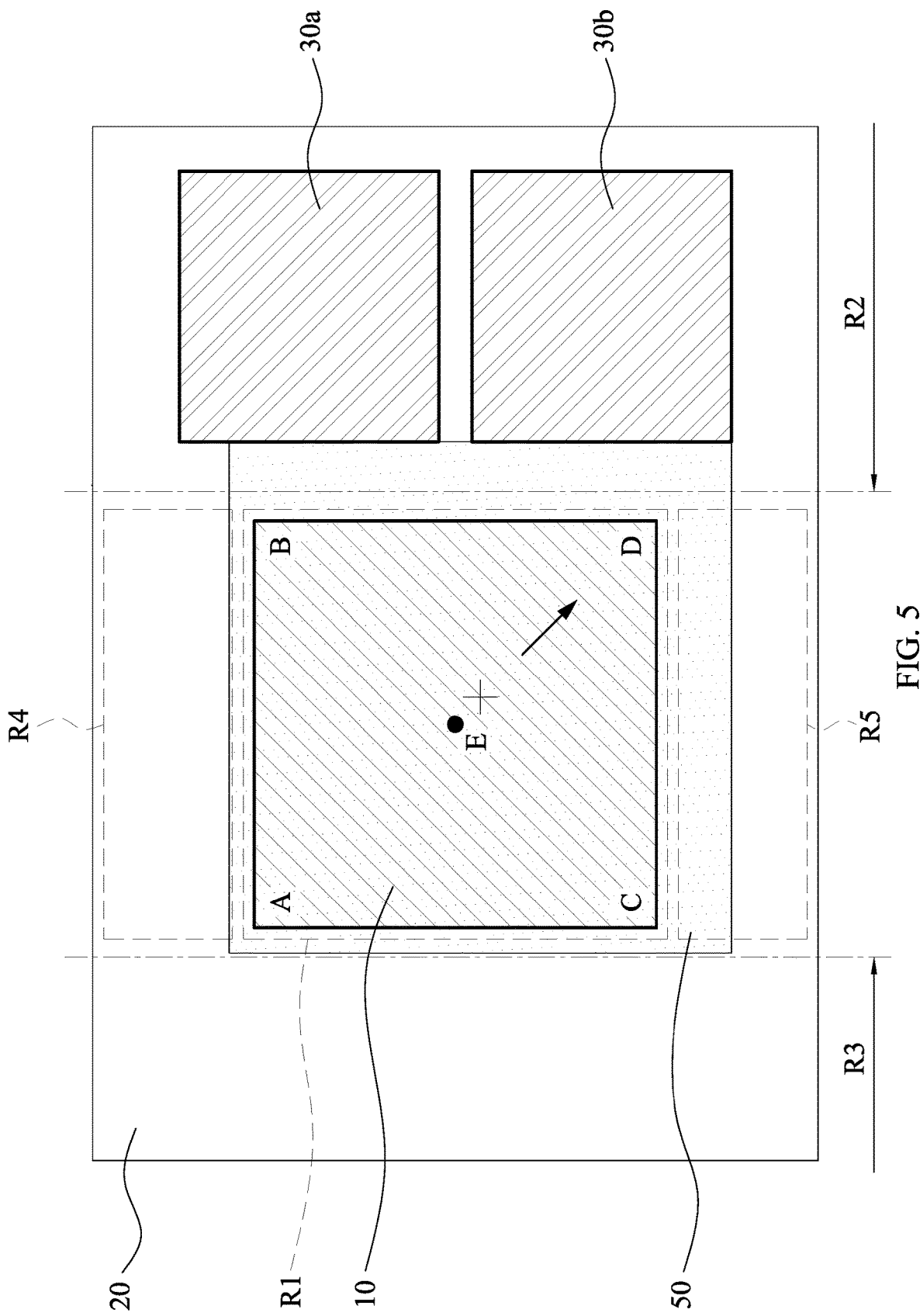
FIG. 5 illustrates a top view of a stage of a method for manufacturing a semiconductor package structure according to some embodiments of the present disclosure.

FIG. 5 illustrate a top view of a stage of a method for manufacturing a semiconductor package structure according to some embodiments of the present disclosure. The embodiments illustrated in FIG. 5 are similar to the embodiments illustrated in FIG. 4B except that in FIG. 5 the region R2 includes devices 30a and 30b. In some embodiments, the upper surface of the device 10 has a lowest temperature at corner D in the temperature distribution obtained in a pilot run operation, and therefore, the irradiation of energy beam is carried out under the condition where a center of the energy beam 50 is moved or shifted from being substantially aligned with a center E of the upper surface of the device 10 toward corner D. In some embodiments, the upper surface 20u of the substrate 20 underlying the device 30b may comprising a relatively large amount of materials capable of absorbing or transmitting energy (e.g., heat), a relatively high circuit density or a relatively large number of I/O connections or pads than the upper surface 20u of the substrate 20 underlying the device 30a. By adjusting the position of Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a semiconductor package structure, comprising:
   (a) providing a substrate, wherein an upper surface of the substrate comprises a predetermined region and an energy-absorbing region adjacent to the predetermined region;

(b) disposing a first device in the predetermined region of the upper surface of the substrate; and (c) bonding the first device to the substrate by irradiating an upper surface of the first device with an energy-beam, wherein a center of the energy-beam is moved toward the energy-absorbing region from a first position before bonding.

2. The method of claim 1, wherein the center of the energy-beam is moved toward the energy-absorbing region from substantially a center of the upper surface of the first device before bonding.

3. The method of claim 1, wherein the energy-absorbing region is capable of absorbing more heat than other regions of the upper surface of the substrate adjacent to the predetermined region.

4. The method of claim 1, wherein the energy-absorbing region comprises metal or polysilicon.

5. The method of claim 4, wherein the energy-absorbing region has a metal content greater than other regions of the upper surface of the substrate adjacent to the predetermined region.

6. The method of claim 1, wherein in step (c) the energy-beam covers the entire upper surface of the first device before and after moving the center of the energy-beam.

7. The method of claim 1, wherein in step (a) the substrate further comprises a second device bonded to the substrate at least in the energy-absorbing region.

8. A method for manufacturing a semiconductor package structure, comprising:

(a) providing a substrate, wherein an upper surface of the substrate comprises a predetermined region and a metal-rich region adjacent to the predetermined region;

(b) disposing a first device in the predetermined region of the upper surface of the substrate; and (c) bonding the first device to the substrate by irradiating an upper surface of the first device with an energy-beam, wherein a center of the energy-beam is moved toward the metal-rich region from a first position before bonding.

9. The method of claim 8, wherein the center of the energy-beam is moved toward the energy-absorbing region from substantially a center of the upper surface of the first device before bonding.

10. The method of claim 8, wherein the metal-rich region of the upper surface of the substrate has a metal content greater than other regions of the upper surface of the substrate adjacent to the predetermined region.

11. The method of claim 8, wherein the metal-rich region has a relatively high circuit density than other regions of the upper surface of the substrate adjacent to the predetermined region.

12. The method of claim 8, wherein the metal-rich region comprises a relatively large number of I/O connections or pads.

13. The method of claim 8, wherein in step (c) the energy-beam covers the entire upper surface of the first device before and after moving the center of the energy-beam.

14. The method of claim 8, wherein the energy-beam is laser.

15. A method for manufacturing a semiconductor package structure, comprising:

(a) providing a substrate and disposing a first device on an upper surface of the substrate; and (b) irradiating an upper surface of the first device with an energy beam to form bonding joints between an interface of the substrate and the first device, wherein prior to the irradiation a center of the energy beam is shifted from being substantially aligned with a center of the upper surface of the first device toward a position having a relatively low temperature in a temperature distribution of the upper surface of the first device, wherein in step (b) the energy-beam covers the entire upper surface of the first device before and after the position shift of the center of the energy beam.

16. The method of claim 15, wherein in step (a) the substrate further comprises a second device bonded to the substrate and the first device is disposed adjacent the second device.

17. The method of claim 15, wherein in step (b) the position having a relatively low temperature in a temperature distribution of the upper surface of the first device is near a region of the upper surface of the substrate comprising a relatively large amount of materials capable of absorbing or transmitting heat.

18. The method of claim 15, wherein in step (b) the position having a relatively low temperature in a temperature distribution of the upper surface of the first device is near a region of the upper surface of the substrate having a relatively high circuit density.

19. The method of claim 15, wherein the temperature distribution of the upper surface of the first device is determined in a pilot-run operation comprising:

(i) providing another substrate and disposing another first device on an upper surface of the another substrate;

(ii) irradiating an upper surface of the another first device with an energy beam to form bonding joints between an interface of the another substrate and the another first device wherein a center of the energy-beam is substantially aligned with a center of the upper surface of the another first device; and (iii) obtaining a temperature distribution of the upper surface of the another first device during or after the irradiation of energy-beam in step (ii).

* * * * *